United States Patent
Cowley et al.

(10) Patent No.: US 8,730,074 B1
(45) Date of Patent: May 20, 2014

(54) SUCCESSIVE APPROXIMATION ANALOG-TO-DIGITAL CONVERSION WITH GAIN CONTROL FOR TUNERS

(71) Applicants: Nicholas P. Cowley, Wiltshire (GB); Isaac Ali, Bristol (GB); Viatcheslav I. Suetinov, Swindon (GB); Keith Pinson, Swindon (GB)

(72) Inventors: Nicholas P. Cowley, Wiltshire (GB); Isaac Ali, Bristol (GB); Viatcheslav I. Suetinov, Swindon (GB); Keith Pinson, Swindon (GB)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/740,472

(22) Filed: Jan. 14, 2013

(51) Int. Cl.
*H03M 1/00* (2006.01)

(52) U.S. Cl.
USPC .......... 341/122; 341/118; 341/161; 341/155; 341/160

(58) Field of Classification Search
USPC ................. 341/118–161
See application file for complete search history.

(56) References Cited

U.S. PATENT DOCUMENTS

| | | | | |
|---|---|---|---|---|
| 4,996,529 A * | 2/1991 | Connell | ..... | 341/118 |
| 5,329,281 A * | 7/1994 | Baumgartner et al. | ..... | 341/139 |
| 5,424,738 A * | 6/1995 | Barroue et al. | ..... | 341/118 |
| 5,635,934 A * | 6/1997 | Brown | ..... | 341/118 |
| 5,982,310 A * | 11/1999 | Tanaka | ..... | 341/118 |
| 5,989,005 A * | 11/1999 | Carassale | ..... | 425/194 |
| 6,931,240 B2 * | 8/2005 | Hunton | ..... | 455/130 |
| 7,271,758 B2 * | 9/2007 | Piasecki et al. | ..... | 341/172 |

\* cited by examiner

*Primary Examiner* — Lam T Mai
(74) *Attorney, Agent, or Firm* — Ellis B. Ramirez, PRASS LLP

(57) ABSTRACT

A method and system for implementing a gain control with fine resolution and minimal additional circuitry. The fine digital gain control may be deployed in conjunction with a coarse switched gain at the front end of a sampling receiver. The fine digital gain control mechanism is configured to receive an input signal and moderate gains applied to the received input signal. The output of a low noise amplifier (LNA) is connected to a switched attenuator which provides fine gain stepped gain control. The output of this stage is connected to the switch stage whose output is connected to a charge redistribution successive approximation register digital-to-analog converter (SAR ADC) configured to convert an analog waveform into a digital representation.

27 Claims, 7 Drawing Sheets

US 8,730,074 B1

SUCCESSIVE APPROXIMATION ANALOG-TO-DIGITAL CONVERSION WITH GAIN CONTROL FOR TUNERS

BACKGROUND

Embodiment generally relate to electronic circuit designs, and more specifically to improvements in architectural arrangements which enable enhanced performance and/or features for direct sampling tuner, and specifically to direct conversion sampling receivers which include a successive approximation analog-to-digital converter (SAR-ADC) to enhance quality of sampling receivers, where the SAR-ADC incorporates a current redistribution digital-to-analog converter (DAC), with gain control.

Direct conversion sampling receivers (DSRs) are a relatively new realization and are highly suited to implementation on an ultra-high speed digital process since the receiver architecture eliminates the requirement for significant analogue circuits such as operational amplifier (op-amp) based continual time filters. DSRs are used in, for example, cable modems, satellite set top boxes, cable set top boxes, and the like. However, in many DSRs in order to compensate for a wide amplitude range of received signals, the input signals are subjected to amplitude adjustment using fine digital gain control ("FDGC"). FDGC allows for the selection and adjustment of gain to be applied to an input signal. Amplitude adjustment or so called gain adjustment of an incoming signal by an FDGC is used to achieve an amplitude level well above the noise and offset thresholds. Without the application of gain adjustment, it may not be feasible to perform further post processing of an incoming signal, such as adaptive equalization and digital conversion.

Many techniques are known for implementing fine digital gain control such as switched gm stages, field effect transistor (FET) switched R-2R ladders and the like. All these approaches have major disadvantages such as adding to thermal noise, intermodulation associated with the additional circuits, adding to circuit complexity, and since they are typically preceded by an amplifier stage with a fixed gain or with a small range of coarse gain steps the output amplitude will increase in sympathy with the input and so potentially lead to compression and further intermodulation distortion in the output.

Therefore, there is a need in the art for an architectural arrangement which substantially overcomes the aforementioned undesired characteristics.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
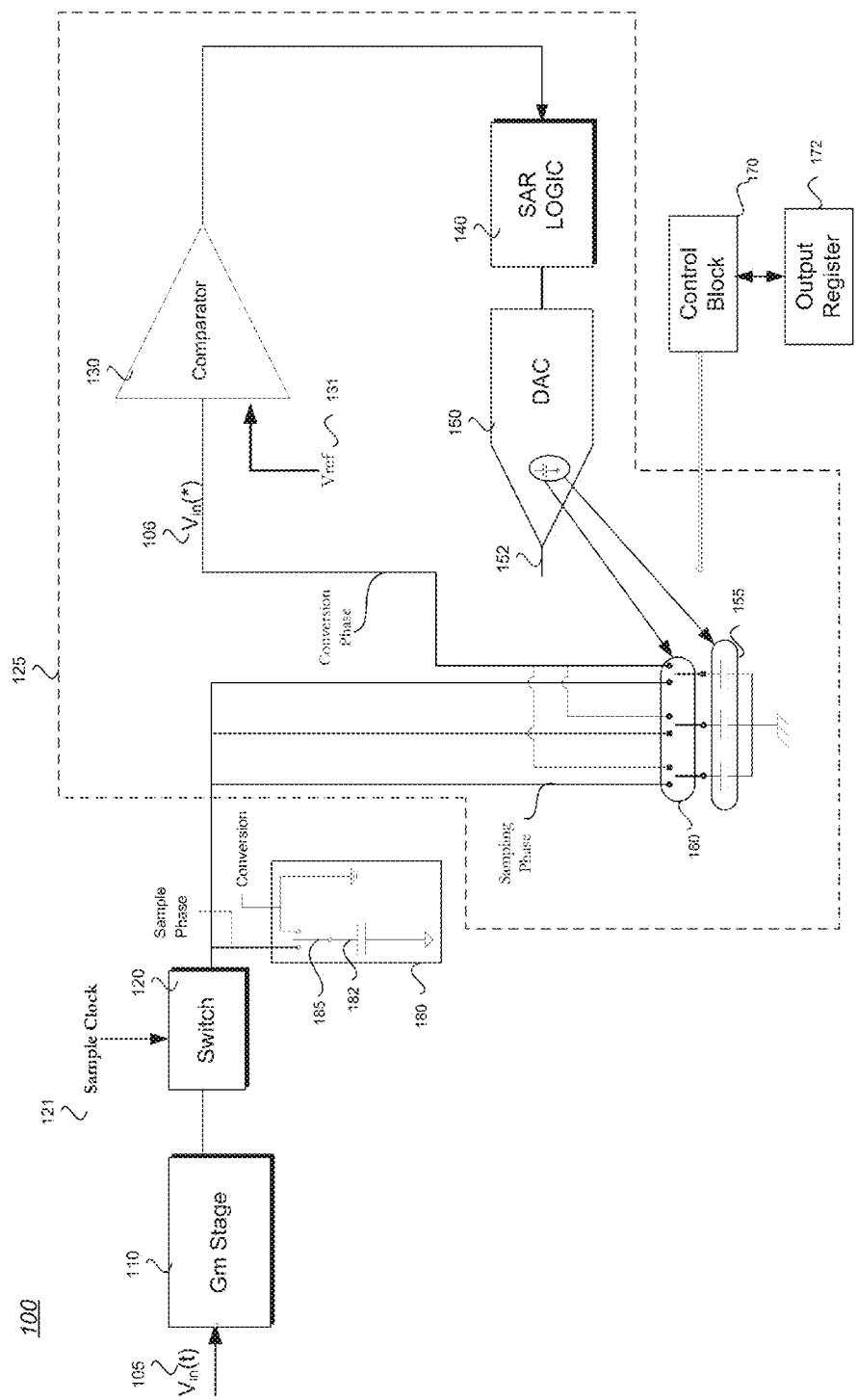
FIG. 1 is an illustration of a direct sampling tuner/receiver (DSR) having charge redistribution SAR-ADC architecture with variable gain control component in accordance to an embodiment.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the preset invention may be practiced without these specific details. In other instances, well-known methods, procedures, components and circuits have not been described in detail so as not to obscure the present invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations. The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

FIG. 1 is an illustration of a direct sampling tuner/receiver 100 (DSR) having charge redistribution SAR-ADC architecture with variable gain control component in accordance to an embodiment. The illustrated direct sampling receiver (DSR) 100 is implemented to process received signals 105, such as signal $V_{in}$ (t), with charge redistribution SAR-ADC 125. A front end of the DSR 100 includes a low noise amplifier (LNA). The LNA may be a gm stage 110 outputting a current which is switched to the SAR-ADC. The Gm stage 110 amplifies the received signal 105 (Vin (t)). In one example, the front end of the DSR 100 also includes a sampling switch 120. The sampling switch 120 is selectively switched in accordance with a sampling clock signal (sample clock 121), switched to pass a selected sample of the amplified signal to the SAR-ADC 125.

In one example, the DSR 100 further includes a variable gain control component 180, which provide a variable load to the Gm stage 110. Known techniques for implementing gain control include switched gm stages, FET switched R2R ladders and the like. These devices are known for introducing thermal noise, adding circuit complexity, and causing or increasing inter-modulation. Some of these known techniques additionally tend to cause compression and inter-modulation distortion with down stream components which tends to manifest in the output. Gain control component 180 is implemented as a capacitor or an array of capacitors. A gain control capacitor ($C_{Gain}$) component can deliver an accurate and predictable gain step that overcomes additive noise and intermodulation associated with traditional techniques. Gain control component 180 comprises capacitor 182, which may consist of a multiple component array, and switch 185. Switch 185 is positioned based on the operation of SAR-ADC 125, i.e., the sample and conversion phases. During the sampling phase, switch 185 like mode switch 160 is placed in sample period position. As shown there is one mode switch 160 per capacitor. During the sample period the switches form a circuit with the output side of sampling switch 120. During the conversion phase the connection with the sampling switch is broken.

SAR ADC 125 can include various subcircuits, including comparator circuit 125, internal digital-to-analog converter (DAC) 150, SAR logic 140, and control logic block 170 with result register. Comparator 130 can compare an input voltage (Vin(*) 106) which is the output voltage 152 (Vcomp) of DAC 150 against a reference voltage Vref 131 and can output the result of the comparison to SAR LOGIC block 140. SAR logic 140 can include a successive approximation register designed to supply an approximate digital code of the input voltage, Vin(*) 106, to DAC 150. DAC 150 is shown associated with comparator 130, capacitor banks or array of capacitors 155, mode switches 160 each coupled to a capacitor in the array of capacitors, and sampling switch 120 is associated with a low noise amplifier (LNA) and one element of the array of capacitors. An input of comparator 130 is coupled to a reference voltage Vref. The closing or opening of each of the mode switches 160 is controlled by control block 170. The closing or opening of the sampling switch 120 is controlled by a sampling clock signal to selectively activate. A resulting code of a digital approximation of the sampled input voltage Vin (*) 106 can be outputted at the end of a conversion to an output register 172 at control block 170 or as a separate circuit block. In accordance with various embodiments, SAR-ADC 125 can be implemented as a charge redistribution SAR-ADC. For clarity, power supplies (positive Vdd, negative Vee), as well as ground connections, are assumed to be present, but not shown in the Figure.

The closing or opening of each of the mode switches 160 and/or switch 185 is controlled by control block 170. The closing or opening of sampling switch 120 is controlled by a sampling clock signal to selectively activate the sampling switch. The sample clock may be externally generated, generated by control block 170, or by a programmed multivibrator in DSR 100.

A control block 170 based on the stored instructions such as values and/or number of iterations that correspond to a predetermined resolution, determines the switching of switch 160. The opening and closing of the switch is predetermined by the number of samples from sample switch 120 which sets the sampling phase duration, and the number of cycles required to run the logic to switch the charge redistribution digital-to-analog converter output. Switch 160 is controlled to two distinct configurations or phases. These configurations are (a) a sampling mode configuration and (b) a conversion mode configuration.

In the first configuration, referred to as the sampling phase/mode, the Gm stage, 110, through the switch, 120, charges the array of capacitors 155, i.e., mode switch 160 couples the capacitors to the output of sampling switch 120, to integrate the current output sampled by the sampling switches; each capacitor in the array of capacitors would normally be discharged before this period. In addition during the sampling period capacitor 182 in gain control element 180 is also connected to the output of sampling switch 120. ADC capacitor array and capacitor 182 create a parallel bank of capacitors during the sampling phase.

In the second configuration, referred to as the conversion mode/phase, After the requisite number of samples the DAC array of capacitors is then isolated from the input sampling switches and transitioned back to normal charge distribution function within the SAR-ADC wherein the array of capacitors are switched between supply voltage (Vdd) and ground (Vss) which redistributes the stored charge between the elements such that the resultant voltage on the capacitor is V=Q/C trends towards the reference voltage of the comparator 130. The output of comparator 130 then processed through quantization loop of SAR logic 140 and CDAC 150 until the number of iterations is produced and a predetermined resolution. Since the illustrated architecture is based on charge sampling and redistribution around the SAR-ADC capacitors the performance can be enhanced by redistribution of the capacitors and amplifiers (gm) during the sampling phase.

While a single stage is shown in this embodiment the gain control component can be deployed in an interleaved system, in which case the $C_{GAIN}$ may be preferably reused between multiple placements of the SARADC which may be incorporated so that when a first SARADC 125 is sampling the second is converting, and vice versa. More than 2 SAR ADCs 125 may be deployed in this manner for example if the conversion periods are substantially longer than the sampling; for example consider a sampling to conversion period ratio of 1:2, three segments may be deployed so that when one segment is converting firstly a second segment samples the input for half the conversion period of the first and then a third segment samples for the other half conversion period of the first. In all such cases the capacitor 182 can be reused for the sampling period of each and all segments, since it is only used during the sampling period.

Figure 2:
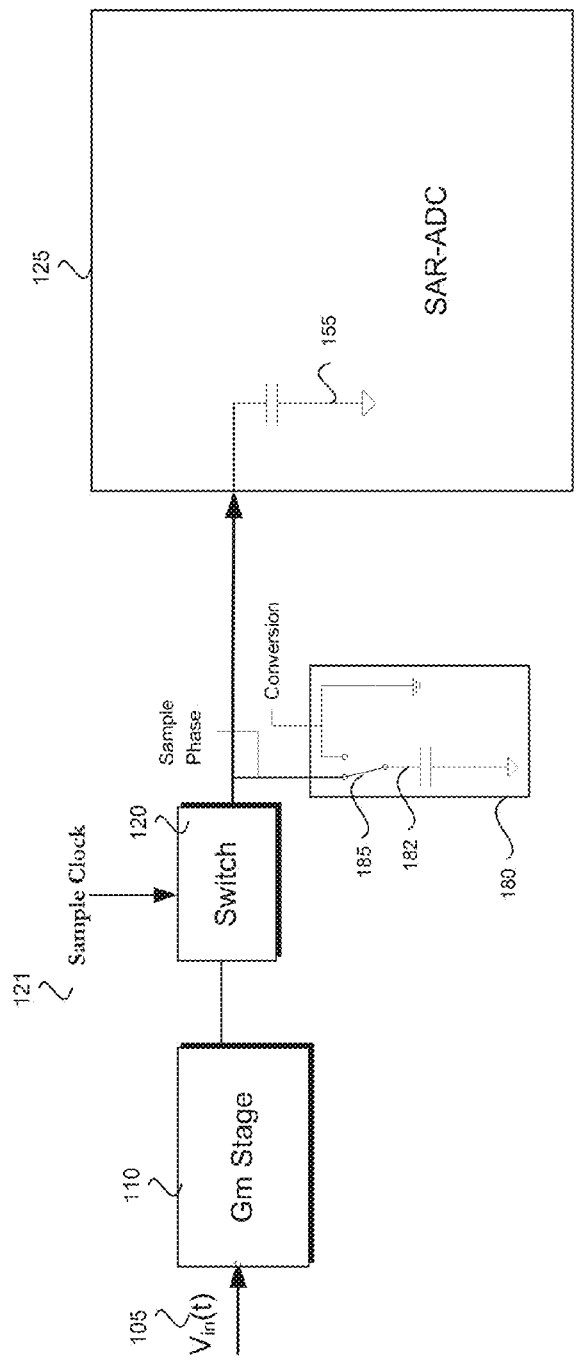
FIG. 2 is an illustration of the DSR of FIG. 1 during the sample phase in accordance to an embodiment.

FIG. 2 is an illustration of the DSR of FIG. 1 during the sample phase in accordance to an embodiment. Here, a gain control component 180, capacitor 182 ($C_{Gain}$), can be introduced to scale the dynamic input range of the SAR-ADC 125. During the sampling phase, the SAR-ADC 125 can be connected to the output of Gm stage 110 via sampling switch 120. The total charge stored in SAR-ADC 125 and the gain control components after the sampling phase can be defined as: $Q_{tot}=(C_{ADC}+C_{Gain})*Vin$; where Vin is the voltage at sampling switch 120 after it was amplified and $C_{ADC}+C_{Gain}=C_{TOT}$. As shown, from the point of view of the front end of DSR 100 it appears that the load is two capacitors, ADC capacitor array 155 and capacitor 182, connected in parallel. The theoretical load is represented in the "s" domain by: $1/SC_{TOT}$ where $C_{TOT}=C_{ADC}+C_{GAIN}$. By switching the capacitor 182 in during the sample phase the voltage generated (Vin) will be reduced by the additional capacitance, so providing gain control. The Gain control can be raised or lowered by changing the overall capacitance of gain control component 180.

Figure 3:
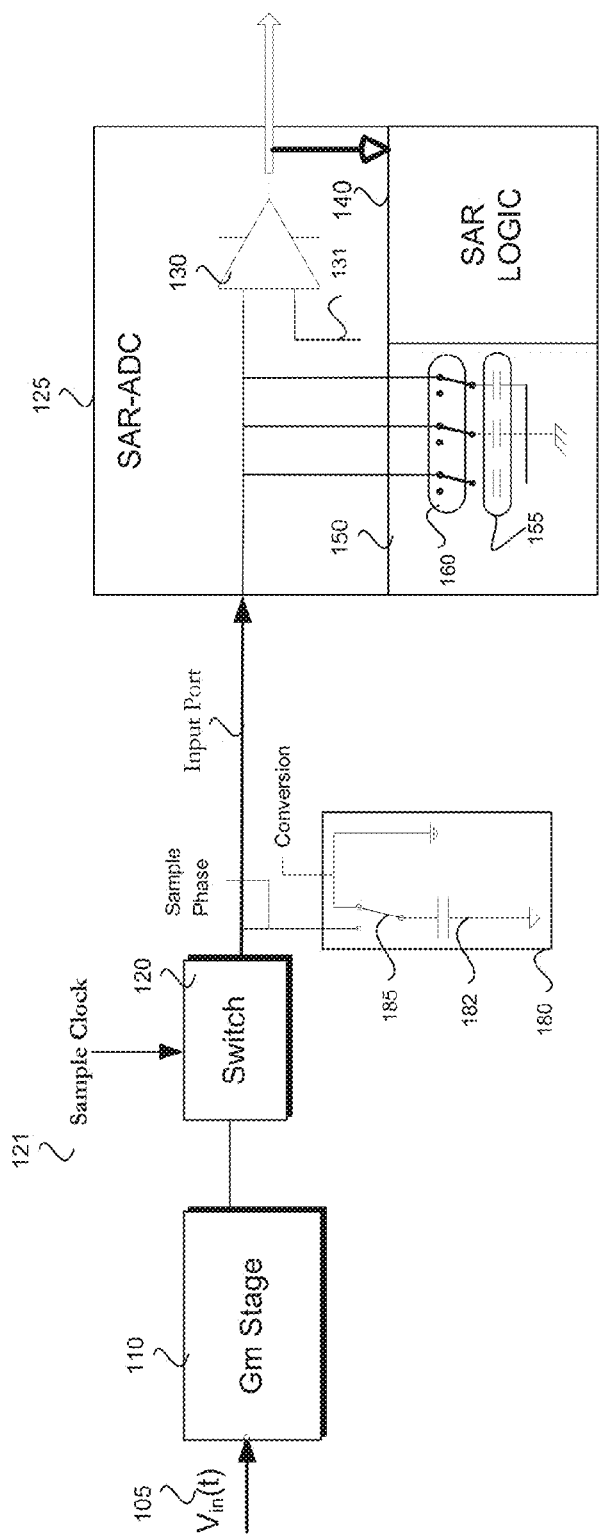
FIG. 3 is an illustration of the DSR of FIG. 1 during the conversion phase in accordance to an embodiment.

FIG. 3 is an illustration of the DSR of FIG. 1 during the conversion phase in accordance to an embodiment. After the requisite number of samples the array of capacitors 155 is then isolated from the input sampling switch 120 and transitioned back to normal charge distribution function within the SAR-ADC wherein the array of capacitors are switched (mode switch 160) between supply voltage (Vdd) and ground (Vss) which redistributes the stored charge between the elements such that the resultant voltage on the capacitor is V=Q/C trends towards the reference voltage 131 of comparator 130. The output of comparator 130 then processed through quantization loop of SAR logic 140 and DAC 150 until the number of iterations is produced and a predetermined resolution. Additionally, during the conversion stage the additional capacitance in gain control component 180 (Capacitance 182) must be switched or isolated away from the SAR-ADC capacitor to allow correct operation of the charge redistribution DAC, i.e., ADC capacitor array 155. Switching the additional capacitance away from the ADC capacitor array 155 will not modify the voltage stored in the ADC capacitor hence the reduced signal amplitude generated during the sampling period will be maintained into the conversion period. Further, the isolated additional capacitor may be discharged (connecting capacitor 182 to ground) to allow correct operation during the next sample/conversion cycle.

Figure 4:
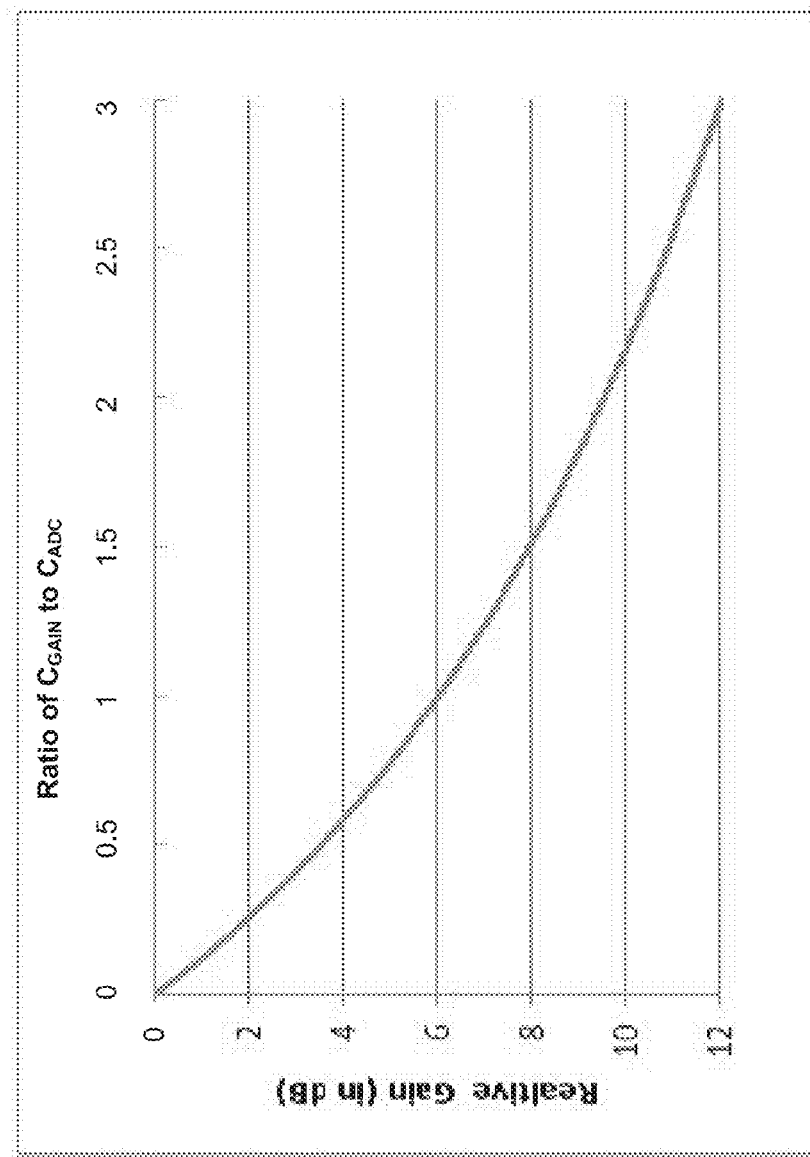
FIG. 4 is an illustration of gain control characteristic with $C_{GAIN}$ expressed as a ratio to $C_{ADC}$ in accordance to an embodiment.

FIG. 4 is an illustration of gain control characteristic with $C_{GAIN}$ expressed as a ratio to $C_{ADC}$ in accordance to an embodiment. The variation in gain with $C_{GAIN}$ is shown in FIG. 4.

Figure 5:
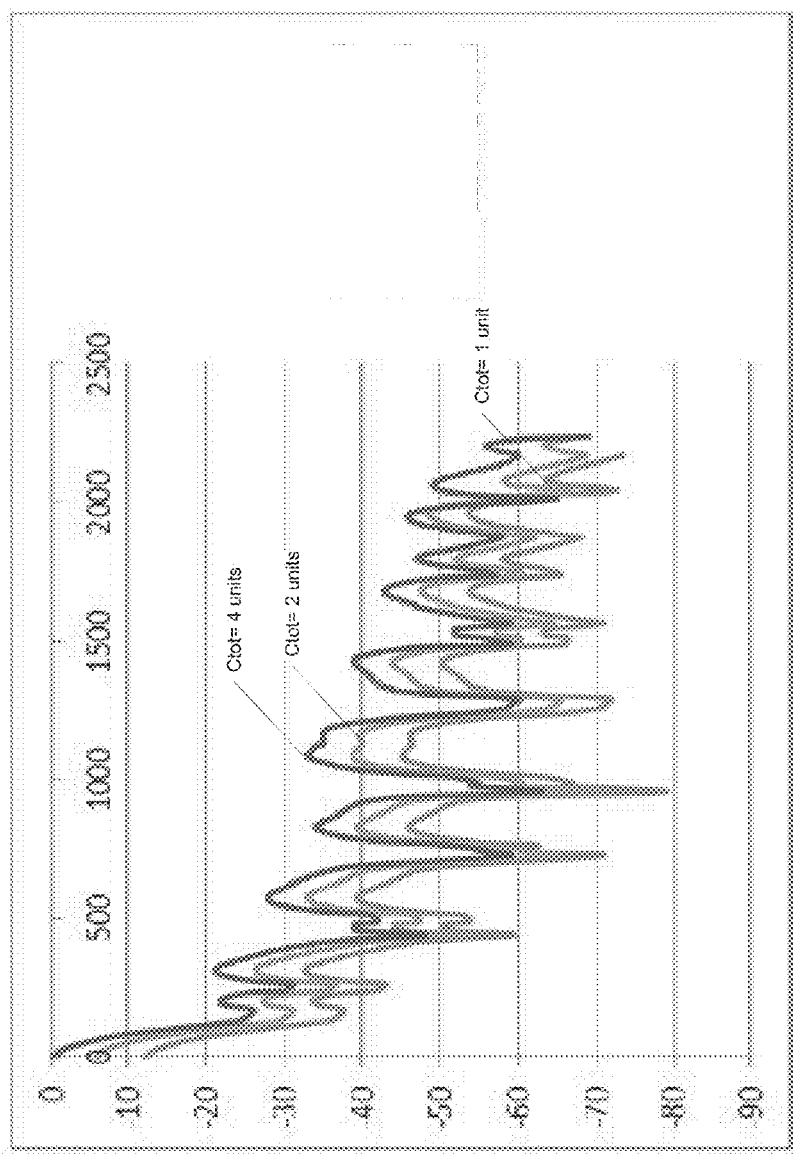
FIG. 5 is an illustration of gain control characteristic with $C_{Tot}$ ratio of 4:2:1 in frequency domain in accordance to an embodiment.

FIG. 5 is an illustration of gain control characteristic with $C_{Tot}$ ratio of 4:2:1 in frequency domain in accordance to an embodiment. The gain control characteristic is constant with frequency offset as displayed in FIG. 5. This figure shows the gain characteristic for $C_{TOT}$ a 1:2:4 for a 4 segment (Gm segment 1 . . . Gm segment 4) direct sampling receiver. As can be seen the gain offset between simulations is approximately six (6) dB as predicted and furtherly that the relative attenuation is constant with frequency maintaining the sampled filter characteristic.

Figure 6:
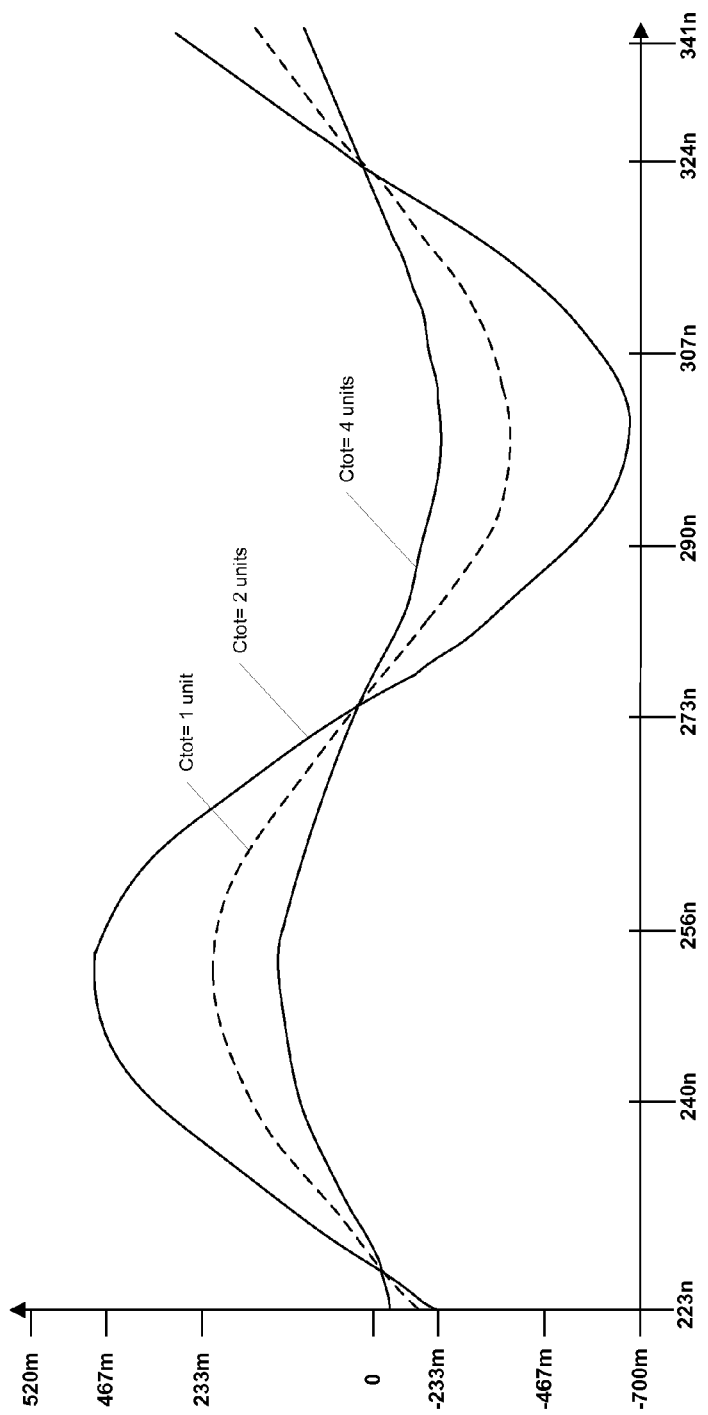
FIG. 6 is an illustration of gain control characteristic with $C_{Tot}$ ratio of 4:2:1 in time domain in accordance to an embodiment.

FIG. 6 is an illustration of gain control characteristic with $C_{Tot}$ ratio of 4:2:1 in time domain in accordance to an embodiment. As can be seen from FIG. 6, an additional feature of this architecture is that since the signal is input as a current there is theoretically no change in phase as the gain is adjusted Phase shift can be a particularly problematic effect since digital modulation techniques employ phase information of the carrier as part of the encoding, for example 64 QAM has 64 data locations each with a unique phase and amplitude information, therefore any phase shift associated with a gain change can lead to a corruption in the data location and corruption in the data.

Figure 7:
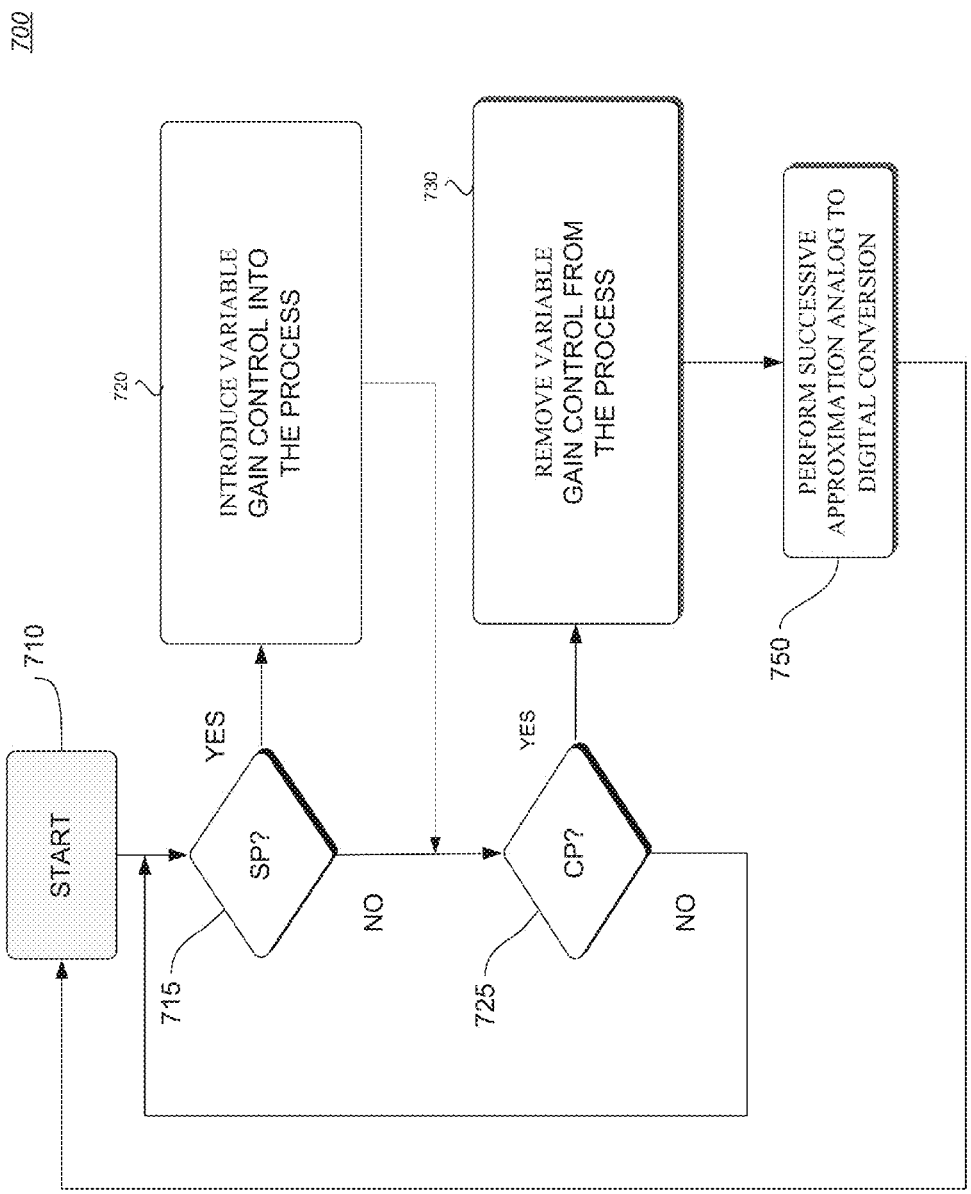
FIG. 7 is a flow diagram illustrating actions in a method 700 for introducing variable gain control to an analog to digital conversion based on the architecture of FIG. 1 in accordance to an embodiment.

FIG. 7 is a flow diagram illustrating actions in a method 700 for introducing variable gain control to an analog to digital conversion based on the architecture of FIG. 1 in accordance to an embodiment. Method 700 begins with start 710. Control is then passed to action 715. Action 715 is based on the positioning of mode switch 160. If the sampling mode has been selected then control is passed to action 720 for further processing in accordance to a sampling process. Action 720 introduces variable gain control into the process by toggling switch 185 to the sample phase. After action 720 control is passed to action 725. In action 725 if switch 160 is in the conversion mode then control is passed to action 730 for further processing. If switch 160 is not set to conversion mode then control is passed to action 715 for further processing.

When control is passed to action 730 the gain control component is isolated from the array of capacitors at SAR-ADC 125 and the resultant voltage in the capacitors are compared against a reference voltage Vref 131 at comparator 130. Control is then passed to action 750 where SAR-ADC is performed on the charges (Q) in the array of capacitors. After a predetermined number of iterations control is then passed to action 710 and the process is restarted.

The techniques described herein may be embodied in a computer-readable medium for configuring a computing system to execute the method. The computer readable media may include, for example and without limitation, any number of the following: magnetic storage media including disk and tape storage media; optical storage media such as compact disk media (e.g., CDROM, CDR, and the like) and digital video disk storage media; holographic memory; nonvolatile memory storage media including semiconductor-based memory units such as FLASH memory, EEPROM, EPROM, ROM; ferromagnetic digital memories; volatile storage media including registers, buffers or caches, main memory, RAM, and the like; and data transmission media including permanent and intermittent computer networks, point-to-point telecommunication equipment, carrier wave transmission media, the Internet, just to name a few. Other new and various types of computer-readable media may be used to store and/or transmit the software modules discussed herein. Computing systems may be found in many forms including but not limited to mainframes, minicomputers, servers, workstations, personal computers, notepads, personal digital assistants, various wireless devices and embedded systems, just to name a few. A typical computing system includes at least one processing unit, associated memory and a number of input/output (I/O) devices. A computing system processes information according to a program and produces resultant output information via I/O devices.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, while certain features of the embodiment have been illustrated and described herein, many modifications, substitutions, changes, and equivalents may occur to those skilled in the art. It is, therefore, to be understood that the appended claims are intended to cover all such modifications and changes as fall within the true spirit of the invention.

We claim:

1. A method to control gain in a receiver, the method comprising:
   during a sample phase, coupling a gain control component and an ADC capacitor array to a sampling switch, wherein the sampling switch connects an input end to an amplifier; and
   during a conversion phase, isolating the gain control component from the ADC capacitor array, and coupling the ADC capacitor array to a comparator.

2. The method in accordance with claim 1, wherein the gain control component is a capacitor or an array of capacitors.

3. The method in accordance with claim 2, wherein the sampling switch is selectively switched in accordance with a sampling clock signal.

4. The method in accordance to claim 3, wherein the sample phase further comprises charging a capacitor segment of the ADC capacitor array.

5. The method in accordance to claim 4, wherein isolating the gain control component from the ADC capacitor array is switching the gain control component to ground.

6. The method in accordance to claim 5, wherein the gain control component when coupled to the sampling switch varies an amount of charge in the ADC capacitor array prior to the conversion phase.

7. The method in accordance to claim 6, wherein the amount of charge in the ADC capacitor array is lowered by a factor which is proportional to gain control component capacitance.

8. The method in accordance to claim 5, wherein the gain control component provides a variable load to an amplified input signal.

9. The method in accordance to claim 8, wherein the variable load presented by the gain control component is $1/SC_{TOT}$, where $C_{TOT}=C_{ADC}+C_{GAIN}$.

10. An apparatus comprising:
a sampling switch configured to have one end electrically connected to an amplified input signal and an other end electrically connected to a gain control component and an ADC capacitor array to control connection and disconnection between the input terminal and the other end of the first sampling capacitor in accordance with a sampling signal; and
a control circuitry having a set of instructions, wherein the set of instructions causes the control circuitry to:
during a sampling phase, coupling the gain control component and the ADC capacitor array to the sampling switch; and
during a conversion phase, isolating the gain control component from the ADC capacitor array and coupling the ADC capacitor array to a comparator.

11. The apparatus in accordance to claim 10, wherein the gain control component is a capacitor or an array of capacitors.

12. The apparatus in accordance to claim 11, wherein the sampling switch is selectively switched in accordance with a sampling clock signal.

13. The apparatus in accordance to claim 12, wherein the sampling phase further comprises charging a capacitor segment of the ADC capacitor array.

14. The apparatus in accordance to claim 13, wherein isolating the gain control component from the ADC capacitor array is switching the gain control component to ground.

15. The apparatus in accordance to claim 14, wherein the gain control component when coupled to the sampling switch varies an amount of charge in the ADC capacitor array prior to the conversion phase.

16. The apparatus in accordance to claim 15, wherein the amount of charge in the ADC capacitor array is lowered by a factor which is proportional to gain control component capacitance.

17. The apparatus in accordance to claim 14, wherein the gain control component provides a variable load to an amplified input signal.

18. The method in accordance to claim 17, wherein the variable load presented by the gain control component is $1/SC_{TOT}$, where $C_{TOT}=C_{ADC}+C_{GAIN}$.

19. A circuit comprising:
a successive approximation register digital-to-analog converter (SAR ADC) having an input port connectable to a sampling switch with input end connected to an amplifier, the SAR ADC configurable to convert an analog waveform into a digital representation using a binary search and outputting the digital representation to an output register; and
a gain control component with selectable switch to couple the input port to the gain control component during a sampling phase and to decouple the input port from the gain control component during a conversion phase.

20. The circuit in accordance to claim 19, wherein the SAR ADC comprises a charge redistribution capacitor array.

21. The circuit in accordance to claim 20, wherein the gain control component is a capacitor or an array of capacitors.

22. The circuit in accordance to claim 21, wherein the sampling switch is selectively switched in accordance with a sampling clock signal.

23. The apparatus in accordance to claim 22, wherein to decouple the gain control component from the charge redistribution capacitor array is switching the gain control component to ground.

24. The circuit in accordance to claim 23, wherein the gain control component when coupled to the sampling switch varies an amount of charge in the charge redistribution capacitor array prior to the conversion phase.

25. The circuit in accordance to claim 24, wherein the amount of charge in the charge redistribution capacitor array is lowered by a factor which is proportional to gain control component capacitance.

26. The circuit in accordance to claim 23, wherein the gain control component provides a variable load to an amplified input signal.

27. The method in accordance to claim 26, wherein the variable load presented by the gain control component is $1/SC_{TOT}$, where $C_{TOT}=C_{ADC}+C_{GAIN}$.

* * * * *

UNITED STATES PATENT AND TRADEMARK OFFICE
CERTIFICATE OF CORRECTION

PATENT NO.         : 8,730,074 B1
APPLICATION NO.    : 13/740472
DATED              : May 20, 2014
INVENTOR(S)        : Nicholas P. Cowley et al.

Page 1 of 1

It is certified that error appears in the above-identified patent and that said Letters Patent is hereby corrected as shown below:

In the Claims

In column 8, line 8, in claim 18, delete "method" and insert -- apparatus --, therefor.

In column 8, line 32, in claim 23, delete "apparatus" and insert -- circuit --, therefor.

In column 8, line 48, in claim 27, delete "method" and insert -- circuit --, therefor.

Signed and Sealed this
Twelfth Day of August, 2014

Michelle K. Lee
*Deputy Director of the United States Patent and Trademark Office*